United States Patent
Lentine et al.

(10) Patent No.: US 11,545,815 B1
(45) Date of Patent: Jan. 3, 2023

(54) COMPACT LASER SOURCE WITH FREQUENCY MODULATORS GENERATING MULTIPLE LINES

(71) Applicant: National Technology & Engineering Solutions of Sandia, LLC, Albuquerque, NM (US)

(72) Inventors: Anthony L. Lentine, Albuquerque, NM (US); Grant Biedermann, Albuquerque, NM (US); Michael Gehl, Albuquerque, NM (US); Christopher DeRose, Victor, NY (US); Jongmin Lee, Albuquerque, NM (US); Kevin Michael Fortier, Milwaukie, OR (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 407 days.

(21) Appl. No.: 16/831,350

(22) Filed: Mar. 26, 2020

Related U.S. Application Data (60) Provisional application No. 62/851,744, filed on May 23, 2019.

(51) Int. Cl.
*H01S 5/50* (2006.01)
*G02B 27/10* (2006.01)
*G02F 1/37* (2006.01)
*H01S 5/04* (2006.01)
*H01S 5/0683* (2006.01)
(Continued)

(52) U.S. Cl.
CPC .......... *H01S 5/5045* (2013.01); *G02B 27/106* (2013.01); *G02F 1/3551* (2013.01); *G02F 1/37* (2013.01); *H01S 3/0078* (2013.01); *H01S 3/0085* (2013.01); *H01S 3/0092* (2013.01); *H01S 5/041* (2013.01); *H01S 5/0683* (2013.01); *H01S 5/34* (2013.01); *G02F 2203/48* (2013.01)

(58) Field of Classification Search
CPC .... H01S 5/5045; H01S 5/0683; H01S 3/0085; H01S 3/0075; H01S 3/0092; H01S 5/041; H01S 5/34; G02F 2203/48
See application file for complete search history.

(56) References Cited

U.S. PATENT DOCUMENTS 6,490,068 B1 * 12/2002 Heflinger ......... H04B 10/25751
398/201
7,983,517 B1   7/2011 Watts et al.

OTHER PUBLICATIONS

Birks, T. A. et al., "The Acousto-Optic Effect in Single-Mode Fiber Tapers and Couplers," Journal of Lightwave Technology (1996) 14(11)2519-2529.

(Continued)

*Primary Examiner* — Michael Carter
(74) *Attorney, Agent, or Firm* — Mark A. Dodd (57) ABSTRACT

A compact laser source and a single sideband modulator used therein is disclosed. The compact laser source includes a seed laser and one or more channels, with each channel generating one or more output laser beams having corresponding different wavelengths. The compact laser source can be formed in whole or in part on a single optical motherboard to thereby minimize space and power requirements. By employing the disclosed single sideband modulator, harmonics in the generated output laser beams can be minimized. The compact laser source finds application in an atom interferometer (AI) system, which may be used to measure gravity, acceleration, or rotation of the AI system.

16 Claims, 6 Drawing Sheets

(51) Int. Cl.
*H01S 5/34* (2006.01)
*G02F 1/355* (2006.01)
*H01S 3/00* (2006.01)

(56) References Cited

OTHER PUBLICATIONS

Carraz, O. et al., "Compact and robust laser system for onboard atom interferometry,": Appl. Phys. B (2009) 97:405-411.
Corwin, K. L. et al., "Frequency-stabilized diode laser with the Zeeman shift in an atomic vapor," Applied Optics (1998)37(15):3295-3298.
Derose, C. T. et al., "High Speed Travelling Wave Carrier Depletion Silicon Mach-Zehnder Modulator," 2012 Optical Interconnects Conference, May 20-23, Santa Fe, NM, 2 pages.
Hinton, A. et al.,"A portable magneto-optical trap with prospects for atom interferometry in civil engineering," Phil. Trans. R. Soc. A 375:20160238, 16 pages.
Huang, D. et al., "Towards heterogeneous integration of optical isolators and circulators with lasers on silicon," Optical Materials Express (2018) 8(9):2471-2483.
Izutsu, M. et al., "Integrated Optical SSB Modulator/Frequency Shifter," IEEE Journal of Quantum Electronics (1981) QE-17(11):2225-2227.
Johnson, L. M. et al., "Serrodyne Optical Frequency Translation with High Sideband Suppression," Journal of Lightwave Technology (1988) 6(1):109-112.
Jones, R. et al., "Net continuous wave optical gain in a low loss silcon-on-insulator waveguide by stimulated Raman scattering," Optics Express (2005) 13(2):519-525.
Le Targat, R. et al., "75%-Efficiency blue generation from an intracavity PPKTP frequency doubler," Optics Communications (2005) 247:471-481.
Leveque, T. et al., "A laser setup for rubidium cooling dedicated to space applications," Applied Physics B (2014) 116:997-1004.
Liu, S. et al., "High speed ultra-broadband amplitude modulators with ultrahigh extinction >65 dB," Optics Express (2017) 25(10):11254-11264.
Moore, J. et al., "Efficient Second Harmonic Generation in Lithium Niobate on Insulator," CLEO: Science and Innovations Jan. 2016, 2 pages.
Pavel, N. et al.,"High-Power Continuous-Wave Intracavity Frequency-Doubled Nd:GdVO4-LBO Laser Under Diode Pumping Into the Emitting Level," IEEE Journal of Selected Topics in Quantum Electronics (2005) 11(3):631-637.
Rakholia, A., "High Data-Rate Atom Interferometry for Measuring Dynamic Inertial Conditions," Dissertation, Physics Department, University of New Mexico, Albuquerque, NM, Jul. 2015, 155 pages.
Shirley, J. H., "Modulation transfer processes in optical heterodyne saturation spectroscopy," Optics Letters (1982) 7(11):537-539.
Sinha, S. et al., "Room-Temperature Stable Generation of 19 Watts of Single-Frequency 532-nm Radiation in a Periodically Poled Lithium Tantalate Cyrstal," Journal of Lightwave Technology (2008) 26(24):3866-3871.
Skogen, E. et al., "Integration of high-gain and high-saturation-power active regions using quantum-well intermixing and offset-quantum-well regrowth," Electronic Letters (2004) 40(16), 2 pages.
Strekalov, D. V. et al., "Optical sum-frequency generation in a whispering-gallery-mode resonator," New Journal of Physics (2014) 16:053025, 16 pages.
Theron, F. et al., "Narrow linewidth single laser source system for onboard atom interferometry," Applied Physics B (2015) 118:1-5.
Wang, C. et al., "Ultrahigh-efficiency wavelength conversion in nanophotonic periodically poled lithium niobate waveguides," Optica (2018) 5(11):1438-1441.
Weigel, P. O. et al., "Design of folded hybrid silicon carbide-lithium niobate waveguides for efficient second-harmonic generation," Journal of the Optical Society B (2018) 35(3):593-600.
Xiong, C. et al., "Aluminum nitride as a new material for chip-scale optomechanics and nonlinear optics," New Journal of Physics (2012) 14:095014, 20 pages.
Zhu, L. et al., "Application of optical single-sideband laser in Raman atom interferometry," Optics Express (2018) 26(6): 6542-6553.

\* cited by examiner

Figure 8

COMPACT LASER SOURCE WITH FREQUENCY MODULATORS GENERATING MULTIPLE LINES

RELATED APPLICATIONS

This application claims priority to U.S. Provisional Application No. 62/851,744, filed on May 23, 2019, and entitled "COMPACT LASER SOURCE WITH FREQUENCY MODULATORS GENERATING MULTIPLE LINES," the entirety of which is incorporated herein by reference.

STATEMENT OF GOVERNMENT INTEREST

This invention was made with Government support under Contract No. DE-NA0003 525 awarded by the United States Department of Energy/National Nuclear Security Administration. The Government has certain rights in the invention.

TECHNICAL FIELD

The present invention relates to a compact laser source with one or more frequency modulators that generates multiple finely-tuned lines. The compact laser source may be used in various applications, including an atom interferometer for both interferometric and cooling purposes.

BACKGROUND

There is a need for improved navigational accuracy, especially in systems that cannot depend upon the Global Positioning System (GPS). Some of these systems have employed terrain tracking or star tracking to improve their navigational accuracy. For systems needing extremely high navigational accuracy, for example, better than 0.1 nautical mile per hour of navigating, the systems often employ large and expensive inertial sensors. These navigation systems are only suitable for large, expensive, and low volume applications.

Figure 1A:
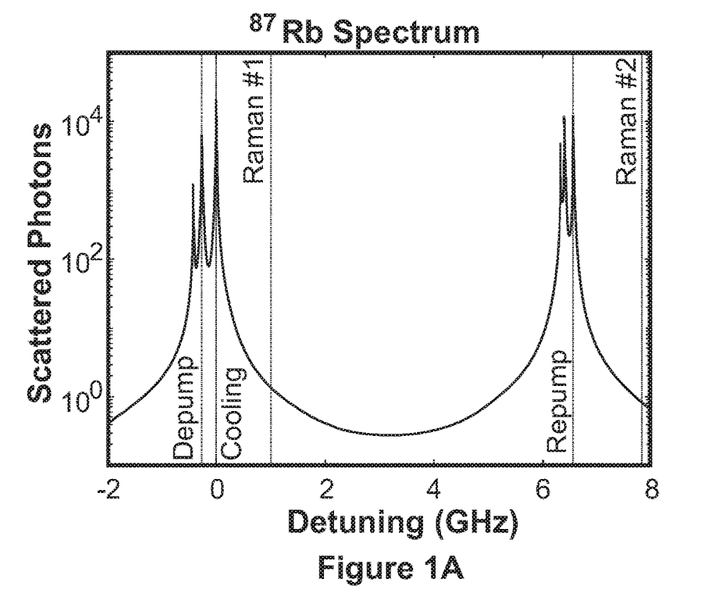

Atom interferometers (AI) provide a means for creating very sensitive gravimeters, accelerometers, and gyroscopes based upon the movement of a cloud of cold atoms in a vacuum chamber. A typical measurement cycle employs laser cooling of the atoms to achieve an atomic cloud temperature of approximately 5 μK. The cloud of atoms is then released and subjected to gravity and any inertial forces imposed on the atoms by movement of the system. The cloud of atoms is subjected to a pair of counter-propagating Raman laser beams three times and finally to a probe laser beam to detect both gravity and any inertial forces imposed on the atoms. The cloud of atoms is then recaptured, and the measurement cycle begins again. The specific wavelengths for a $^{87}$Rb AI are shown in FIG. 1A, with the timing sequence for the various wavelengths shown in FIG. 1B. See, for example, A. Rakholia, "High Data-Rate Atom Interferometry for Measuring Dynamic Inertial Conditions," PhD Thesis at the University of New Mexico (2015), the contents of which are incorporated herein by reference, for a description of an atom interferometer, its operation, and its use in detecting motion.

The laser system for the cooling, Raman, and probe functions must generate several precisely controlled wavelengths, five in the case of the above $^{87}$Rb AI example, at various times. To this end, prior art AI systems typically employed multiple finely-tuned lasers. These systems could readily occupy several cubic feet of space for the optics, along with racks of support electronics needing hundreds of watts of power to run. As many systems do not have the space or power for such a large and power-demanding laser system, the need exists for a compact laser source capable of generating multiple finely-tuned lines for various applications.

SUMMARY

One aspect of the present invention relates to a compact laser source employing a single seed laser, a beam splitter, and one or more channels. Each channel may comprise a frequency modulator, a variable optical attenuator, an optical filter, an optical amplifier, and a frequency doubler, with one channel for each desired wavelength. In other embodiments of the compact laser source, a reduced number of channels may be included in which different wavelengths may be generated in a single channel at different times.

In accordance with at least one embodiment of the present invention, multiple elements are formed on a single photonic motherboard using an integrated approach. Using this single photonic motherboard approach allows a significant reduction in size of the overall device, as well as a significant reduction in the power requirements of the corresponding driving and control electronics.

To enhance the spectral purity of each desired wavelength, a compact laser source in accordance with at least one embodiment of the present invention preferably includes a seed laser with its operating frequency stabilized at a relevant wavelength using a frequency-based feedback loop. This frequency-based feedback loop may employ, for example, a vapor cell holding atoms of the desired type employed in the AI, if the compact laser source is to be used as part of an AI system.

To minimize the magnitude of sidebands, and thereby improve the spectral purity of the desired wavelength, the compact laser source preferably employs a single sideband-type frequency modulator. This single sideband modulator needs careful optical phase and magnitude management for best sideband rejection.

To further minimize the magnitude of sidebands, the compact laser source preferably employs one or more optical filters having very narrow passbands. If each desired wavelength (or frequency) has a dedicated channel, then the optical filter may be designed to work at just the desired wavelength (or frequency). In some embodiments of the present invention, multiple wavelengths (or frequencies) will be generated sequentially by a single channel, for example, the cooling laser beam and the Raman #1 laser beam illustrated in FIGS. 1A and 1B, could be generated with a single channel. In this case, the optical filter must be tunable to the different operating wavelengths, for example, by the thermo-optic or electro-optic effect. By employing multiple serial optical filters, the undesired sidebands can be more completely rejected, especially if the optical filters have different free spectral ranges.

As the amount of power needed for each desired wavelength likely varies, and at times must be in the "off" state, a high extinction variable optical attenuator is preferably employed in the compact laser source.

While each channel may include a frequency doubler, certain preferred embodiments of the present invention may alternatively employ a sum frequency generator or a frequency tripler to generate the desired wavelength.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 1A illustrates the desired wavelengths for a $^{87}$Rb AI system, while

FIG. 4A illustrates a plan view of a traveling wave phase shifter in accordance with at least one embodiment of the present invention, while

DETAILED DESCRIPTION

Figure 2:
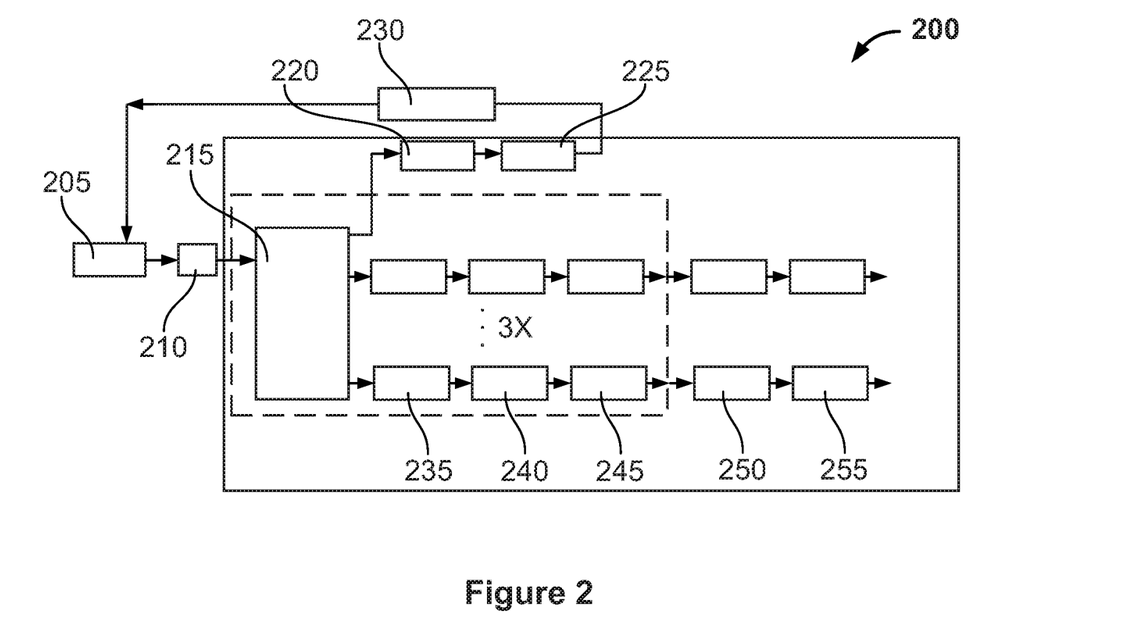
FIG. 2 illustrates a compact laser source in accordance with at least one embodiment of the present invention.

FIG. 2 illustrates a compact laser source 200 in accordance with at least one embodiment of the present invention. The compact laser source 200 includes a single seed laser 205 that outputs a laser beam that first passes through an optical isolator 210. The optical isolator 210 serves to minimize unwanted optical feedback to the seed laser from the remaining downstream optical elements. The laser beam is then split into four beams as it passes through a four-way beam splitter 215. The laser beam from the first of the four outputs of the four-way beam splitter 215 is transmitted to an optical amplifier 220, and from there to a frequency doubler 225. The output from the frequency doubler 225 then goes to a lock circuit 230, which precisely controls the operating wavelength of the seed laser 205. The remaining three beams from the four-way beam splitter 215 pass through three corresponding channels. The beam in each channel is frequency shifted by a frequency shifter 235, is filtered by an optical filter 240, and transmitted through a variable optical attenuator 245. The output laser beam from the variable optical attenuator 245 then passes through an optical amplifier 250, and from there is frequency doubled by a frequency doubler 255. The three laser beams output by the frequency doublers 255 may then be directed to the vacuum chamber of an AI, not illustrated.

Numerous alternative embodiments are also possible. In certain embodiments of the present invention, the compact laser source 200 may include additional optical amplifiers located between the frequency doublers 255 and the vacuum system of the AI, not illustrated. In certain embodiments of the present invention, the order of the optical filters 240 and the variable optical attenuators 245 is reversed. In certain embodiments of the present invention, the number of channels may be as few as one, corresponding to the smallest number of simultaneously required wavelengths, or four or more, which allows dedicating an individual channel to each required wavelength. In certain embodiments of the present invention, various elements may not be required. For example, if the sideband rejection by the frequency shifter 235 is sufficient, an embodiment may not include the optical filter 240. As another example, if the power need only remain approximately constant, an embodiment may not need the variable optical attenuator 245. As yet another example, if high powers are not required, or the seed laser 205 generates sufficient power, an embodiment may not include the optical amplifier 250.

In at least one embodiment of the present invention, the compact laser source 200 is preferably implemented with silicon photonics as an optical motherboard. In this embodiment, the elements may be incorporated heterogeneously and/or monolithically with the silicon photonics optical motherboard. In various other embodiments of the present invention, which specific elements of the compact laser source 200 are incorporated heterogeneously and/or monolithically with the silicon photonics optical motherboard is a design choice and well within the skill of one of ordinary skill in the art. In other embodiments, the compact laser source 200 may employ a $LiNbO_3$—, an InGaAs/InP—, or an AlGaAs-based optical motherboard.

Turning first to the seed laser 205, its operating wavelength (or frequency) should be selected based on the transition wavelength (or frequency) of the type of atoms employed by the AI or other optical system. As an example, if the AI employs rubidium (Rb) atoms, then the preferred operating wavelength of the seed laser is 1560 nm. Operating at this wavelength offers the advantage that it minimizes the effect of spurious signals on the AI sensitivity. Other types of atoms that may be used include, for example, He, Ne, Na, Mg, Ar, K, Ca, Sr, Xe, and Cs. In addition, certain molecules instead of atoms may be used for the AI, including, for example, $Na_2$ and $I_2$.

To be more readily incorporated into a silicon photonics optical motherboard, the seed laser 205 is preferably a semiconductor laser. This semiconductor laser may be an edge emitting laser or a vertical cavity surface emitting laser (VCSEL) as either can be integrated with the silicon photonics motherboard. This semiconductor laser is preferably formed of III-V semiconductor material, for example, InGaAs, if it is to have an operating wavelength of 1560 nm. For applications needing different operating wavelengths, III-V semiconductor materials other than InGaAs may be preferred, for example, InAs, GaAs, AlGaAs, InGaAsP, AlGaInP, InGaP, GaSb, GaInAsSb, GaN, AlN, InGaN, and GaAlN, among others. II-VI semiconductor materials, for example, ZnSe, ZnTe, and ZnMgSSe, may also be used.

The optical isolator 210 may employ any usable technology that provides sufficient optical isolation. See, for example, D. Huang et al., "Towards heterogeneous integration of optical isolators and circulators with lasers on silicon [Invited]," Optical Materials Express, vol. 8, no. 9, pp. 2471-2483 (2018), the contents of which are incorporated herein by reference, for a discussion of optical isolators.

The four-way beam splitter 215 may employ any usable technology that works at the operating wavelength of the seed laser 205, and preferable exhibits minimal losses at the operating wavelength. An exemplary four-way beam splitter 215 may, for example, employ directional, multi-mode interference (MMI), or adiabatic coupler technology. All three coupler technologies can be incorporated into a silicon photonics motherboard and thus are preferred for certain embodiments of the present invention. The four-way beam splitter 215 may be implemented as a cascade of two-way beam splitters in certain embodiments of the present invention.

The optical amplifiers 220, 250 may employ any usable technology that works at the operating wavelength of the seed laser 205, and preferably provides sufficient gain to improve the operating efficiency of the frequency doublers 225, 255. An exemplary optical amplifier 220, 250 may, for example, include those that employ one, two, or three gain stages of III-V or II-VI multiple quantum well material. As will be appreciated by one of ordinary skill in the art, placing optical amplifiers 220, 250 before frequency doublers 225, 255 enhances the efficiency of the frequency doublers 225, 255.

A two-stage semiconductor optical amplifier that may be employed as the optical amplifier 220, 250 employs a high gain region and a high saturation power region. See, for example, E. Skogen et al., "Integration of high-gain and high-saturation-power active regions using quantum-well intermixing and offset-quantum-well regrowth," Electronics Letters, Vol. 40, No. 16, PP. 993-994 (2004), the contents of which are incorporated herein by reference. The first high gain region includes a centered multiple quantum well (c-MQW) section that provides high optical confinement, thereby enabling high gain. The high saturation power region includes an offset multiple quantum well (o-MQW) section with low optical confinement, thereby enabling high saturation power. The overall structure may be formed by growing the c-MQW with five to ten multiple quantum wells, a part of which is then subjected to quantum well intermixing. The resultant structure is then subjected to a regrowth process that forms the o-MQW with five to ten multiple quantum wells. The structure is then subjected to an etch to remove the o-MQW material over the c-MQW material such that only the o-MQW material over the quantum well intermixed material remains.

The frequency doublers 225, 255 may employ any usable technology that works at the operating wavelength of the seed laser 205, and preferable is highly efficient. An exemplary frequency doubler 225, 255 may, for example, include those that employ one or more lithium niobate (LN), lithium tantalate (LT), potassium titanyl phosphate (KTP), lithium triborate (LBO), or aluminum nitride (AlN) elements, which are all electro-optic materials. See, for example, J. Moore et al., "Efficient Second Harmonic Generation in Lithium Niobate on Insulator," Conference on Lasers and Electro-Optics: Science and Innovations 2016, STh3P.1 (2016), C. Wang et al., "Ultrahigh-efficiency wavelength conversion in nanophotonic periodically poled lithium niobite waveguides," Optica, Vol. 5., No. 11, PP. 1438-1441 (2018), and P. O. Weigel and S. Mookherjea, "Design of folded hybrid silicon carbide-lithium niobite waveguides for efficient second-harmonic generation," Journal of the Optical Society of America B, Vol. 35, No. 3, PP. 593-600 (2018), the contents of each of which are incorporated herein by reference, for discussions of LN frequency doublers. See, for example, S. Sinha et al., "Room-Temperature Stable Generation of 19 Watts of Single-Frequency 532-nm Radiation in a Periodically Poled Lithium Tantalate Crystal," Journal of Lightwave Technology, Vol. 26, No. 24, PP. 3866-3871 (2008), the contents of which are incorporated herein by reference, for a description of a periodically poled LT frequency doubler. See, for example, R. Le Targat et al., "75%-Efficiency blue generation from an intracavity PPKTP frequency doubler," Optics Communications, Vol. 247, PP. 471-481 (2005), the contents of which are incorporated herein by reference, for a description of a periodically poled KTP frequency doubler. See, for example, N. Pavel and T. Taira, "High-Power Continuous-Wave Intracavity Frequency-Doubled Nd:GdVo$_4$-LBO Laser Under Diode Pumping Into the Emitting Level, Journal of Selected Topics in Quantum Electronics, Vol. 11, No. 3, PP. 631-637 (2005), the contents of which are incorporated herein by reference, for a description of a LBO frequency doubler. See, for example, C. Xiong et al., "Aluminum nitride as a new material for chip-scale optomechanics and nonlinear optics," New Journal of Physics, Vol. 14, No. 095014 (2012), the contents of which are incorporated herein by reference, for a description of an AlN frequency doubler.

The lock circuit 230 may employ any usable technology that provides feedback to keep the seed laser 205 operating sufficiently precisely at the required operating wavelength. An exemplary lock circuit may employ a dichroic-atomic-vapor laser lock (DAVLL). See, for example, K. L. Corwin et al., "Frequency-stabilized diode laser with the Zeeman shift in an atomic vapor," Applied Optics, Vol. 37, No. 15, PP. 3295-3298 (1998), the contents of which are incorporated herein by reference, for a description of a DAVLL employing a Rb vapor cell. In other embodiments of the present invention, the lock circuit 230 may servo to the signal derived from frequency modulation transfer spectroscopy on a saturated absorption spectrum. See, for example, J. H. Shirley, "Modulation transfer processes in optical heterodyne saturation spectroscopy," Optics Letters, Vol. 7, No. 11, PP. 537-539 (1982), the contents of which are incorporated herein by reference, for a description of modulation transfer processes. In yet other embodiments of the present invention, the lock circuit 230 may include an atomic line-based frequency reference. As the atomic line-based frequency reference may not operate at the desired frequency, the reference frequency can be shifted through the use of a sum frequency generator to the desired reference frequency for the seed laser 205.

The frequency shifters 235 may employ any usable technology that works at the operating wavelength of the seed laser 205, and preferable is highly efficient. Generally, there are several different types of frequency shifters that may be employed: single sideband, serrodyne, and acousto-optic, among others. See, for example, M. Izutsu et al., "Integrated Optical SSB Modulator/Frequency Shifter," IEEE J. of Quantum Electronics, Vol. QE-17, No. 11, PP. 2225-2227 (1981), the contents of which are incorporated herein by reference, for a discussion of single sideband frequency modulators. See, for example, L. M. Johnson and C. H. Cox, "Serrodyne Optical Frequency Translation with High Sideband Suppression," Journal of Lightwave Technology, Vol. 6, No. 1, PP. 109-112 (1988), the contents of which are incorporated herein by reference, for a discussion of serrodyne frequency modulators. See, for example, T. A. Birks et al., "The Acousto-Optic Effect in Single-Mode Fiber Tapers and Couplers," Journal of Lightwave Technology, Vol. 14, No. 11, PP. 2519-2529 (1996), the contents of which are incorporated herein by reference, for a discussion of acousto-optic frequency modulators.

Figure 3:
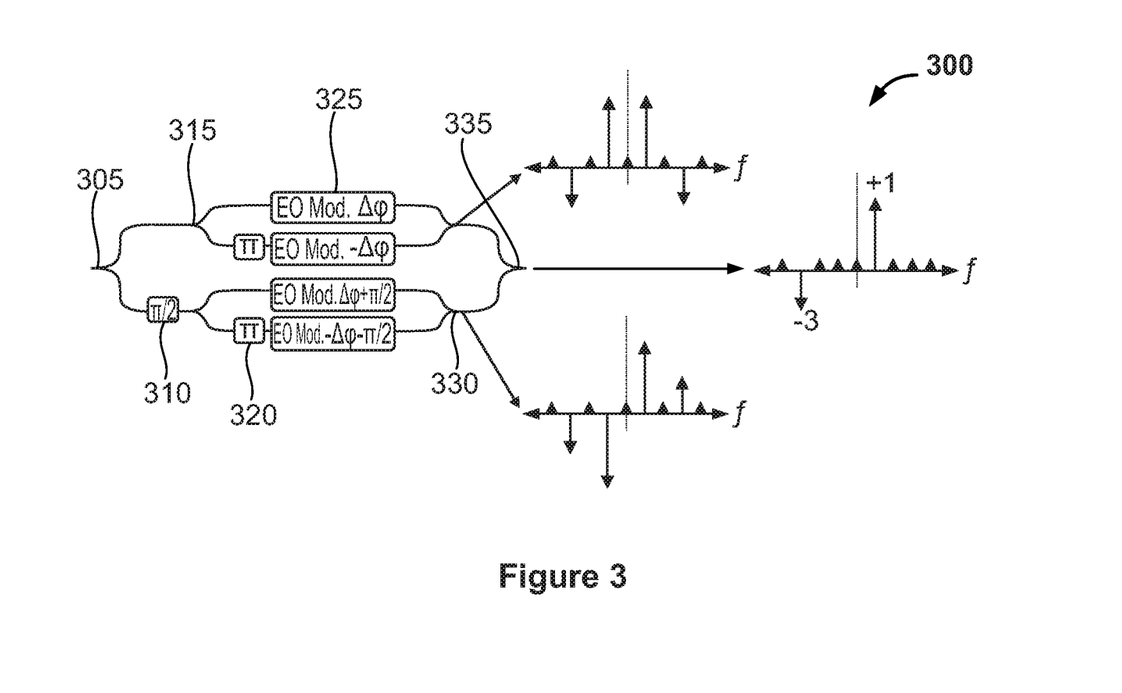
FIG. 3 illustrates a single sideband modulator in accordance with at least one embodiment of the present invention.

In a preferred embodiment, the frequency shifters 235 employ a single sideband frequency modulator 300, as illustrated in FIG. 3. The incoming laser beam passes through a first stage beam splitter 305, with one of the two output laser beams passing through a first stage $\pi/2$ phase shifter 310. Both output beams then pass through corresponding second stage beam splitters 315. One output from each of the second stage beams splitters 315 passes through a corresponding second stage π phase shifter 320. At this point, there exist four laser beams having a wavelength matching the seed laser, but each having a respective 0, π/2, π, or 3π/2 phase shift. Each of these four laser beams then passes through a corresponding frequency modulator 325, with each frequency modulator 325 being modulated by a modulation signal having a desired detuning frequency from the frequency of the seed laser. As an example, and with reference to FIG. 1A, the Raman #1 beam for Rb could be generated using a modulation signal having a frequency of approximately 0.5 GHz, which is subsequently doubled to 1.0 GHz by the frequency doubler 255. The modulation signals for the frequency modulators 325, while having the same modulation frequency, each have respective phase shifts of 0, π/2, π, or 3π/2. After passing through corresponding frequency modulators 325, the four individual beams are recombined using two first stage beam combiners 330, and a single second stage beam combiner 335. The spectral content of the beams at various points in the single sideband frequency modulator 300 are illustrated in the righthand part of FIG. 3. In this example, the final output beam includes components at the +1 and −3 harmonics of the modulation signal relative to the input laser beam.

The first stage π/2 phase shifter 310 and the two second stage π phase shifters 320 are preferably formed using thermo-optic (TO) technology as these phase shifts are constant. In a preferred embodiment, the first stage π/2 phase shifter 310 and the two second stage π phase shifters 320 are preferably formed using doped silicon, for example on either side of the waveguide, as resistive heating sources. An alternative is to use a disk-based TO phase shifter, though these devices typically have a narrower bandwidth and greater optical losses than the doped silicon-based phase shifter designs. A micro-electro-mechanical system (MEMS) based π/2 phase shifter is another alternative.

Figure 4A:
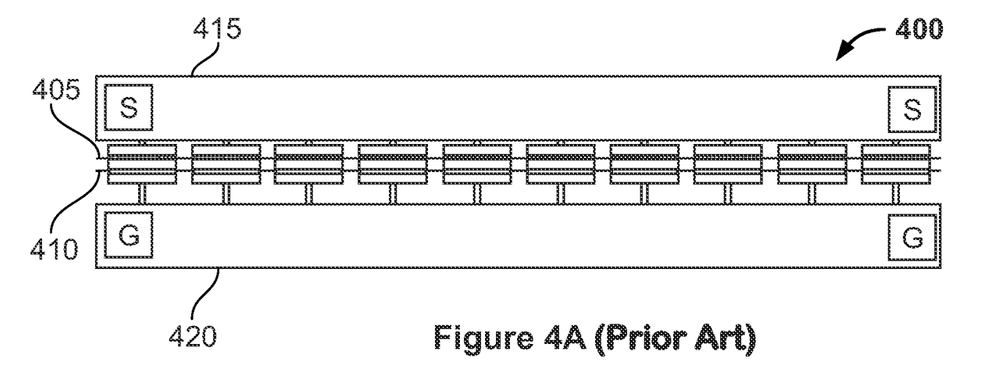
Figure 4B:
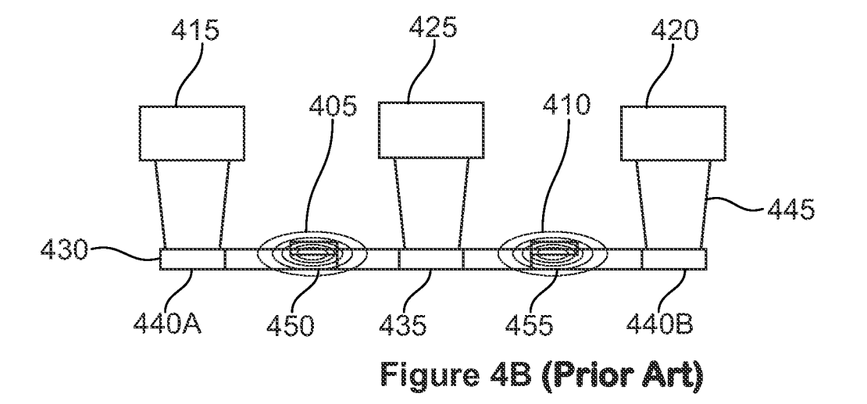
FIGS. 4B and 4C illustrate the traveling wave phase shifter in cross-section.
Figure 4C:
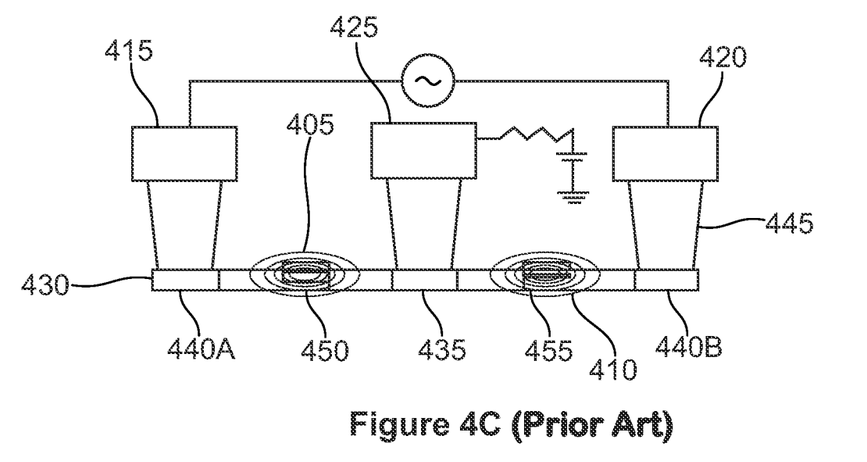

The frequency modulators 325 are preferably formed using electro-optic (EO) technology to allow operation at the detuning frequency, which may be greater than 10 GHz depending upon the wavelength of the seed laser 205. As illustrated in FIG. 4, the EO phase shifter technology in a preferred embodiment of the present invention may be formed of a traveling wave phase shifter 400. See, for example, C. T. DeRose et al., "High Speed Travelling Wave Carrier Depletion Silicon Mach-Zehnder Modulator," presented at 2012 Optical Interconnects Conference, Santa Fe, N. Mex., PP. 135-136 (May 20-23, 2012), the contents of which are incorporated herein by reference. FIG. 4A illustrates the traveling wave phase shifter 400 in a plan view to better show the capacitively loaded slot line configuration of the traveling wave phase shifter 400. FIGS. 4B and 4C illustrate the traveling wave phase shifter 400 in cross-section to show the push-pull carrier depletion effect used to differentially alter the effective index of refraction in the two arms 405, 410. The traveling wave phase shifter 400 includes two outer contacts 415, 420 between which the RF modulation signal is applied, along with a center contact 425 to which a DC bias voltage is applied.

Figure 4D:
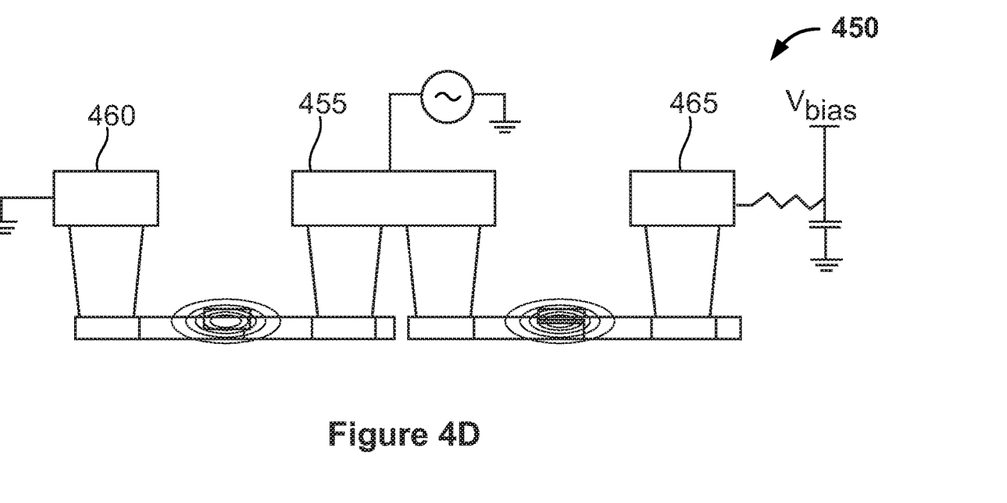
FIG. 4D illustrates a traveling wave phase shifter in cross-section in accordance with at least one alternative embodiment of the present invention.

In alternative embodiments of the present invention, the frequency modulators 325 may be implemented as a traveling wave phase shifter 450 as shown in FIG. 4D. In contrast to the traveling wave phase shifter 400 shown in FIGS. 4B and 4C, the traveling wave phase shifter 450 shown in FIG. 4D applies the RF modulation signal to a center conductor 455, while the outer contacts 460, 465 are either grounded or have a DC bias voltage applied thereto.

The traveling wave phase shifter 400 is preferably formed on a silicon-on-insulator (SOI) wafer 430, in which n-type 435 and p-type 440A, 440B regions are implanted, respectively. The two outer contacts 415, 420 and the center contact 425 are electrically connected to the p-type 440A, 440B and n-type 435 regions through tungsten (W) vias 445. As shown in FIG. 4B, when no modulation signal is applied between the two outer contacts 415, 420, two depletion regions 450, 455, illustrated in white, are of equal size. However, when a modulation signal is applied between the two outer contacts 415, 420, one depletion region 450 widens while the other depletion region 455 narrows, as shown in FIG. 4C. By widening the depletion region 450, the effective index of refraction for this arm 405 of the traveling wave phase shifter 400 increases, while narrowing the other depletion region 455 causes the effective index of refraction for this arm 410 of the traveling wave phase shifter 400 to decrease.

A traveling wave phase shifter 400 of this design can offer various benefits. First, through careful design of the traveling wave phase shifter 400, its impedance can be matched to the traditionally desired 50Ω, thereby simplifying the design of a driver for the traveling wave phase shifter 400. Similarly, the traveling wave phase shifter 400 can be designed such that the microwave velocity matches that of the optical mode, thereby improving frequency response and increasing the bandwidth and efficiency of the traveling wave phase shifter 400.

As imperfect cancelation of the carrier and sidebands by the frequency shifters 235 can reduce the accuracy of an AI system, several elements of the compact laser source 200 serve to minimize these sidebands. Among these sideband reducing elements are the optical filters 240. In a preferred embodiment of the present invention, the optical filters 240 are implemented using a micro-ring resonator with thermal tuning of the resonant wavelength. See, for example, U.S. Pat. No. 7,983,517 to M. R. Watts et al. (2011), the contents of which are incorporated herein by reference. As will be appreciated by one of ordinary skill in the art, the location of the heating element(s) can alter performance of the micro-ring resonator. For example, when the heating element(s) are integrated within the micro-ring resonator itself, the doping profile of the heating element(s), both in density and location, can affect the optical losses within the micro-ring resonator. To improve rejection of the sidebands, these optical losses should be minimized to improve the Q of the micro-ring resonator. As an alternative, the heating element(s) may be external to, but adjacent, the micro-ring resonator. To further improve rejection of unwanted sidebands in a preferred embodiment of the present invention, two, or more, micro-ring resonators may be employed serially. This rejection can be further improved if the serial micro-ring resonators are of different sizes resulting in different, and non-overlapping, free spectral ranges.

Imperfect cancelation of the carrier and sidebands by the frequency shifters 235 may also be due to imperfect optical splitting ratios, i.e., other than 50:50 splitting, by the various beam splitters within the frequency shifters 235. This imperfect optical splitting may be due, for example, to variations in the process used to fabricate the frequency shifters 235. To counter these imperfect optical splitting ratios, one or more additional phase shifters are preferably included in at least one embodiment of the present invention.

Figure 5:
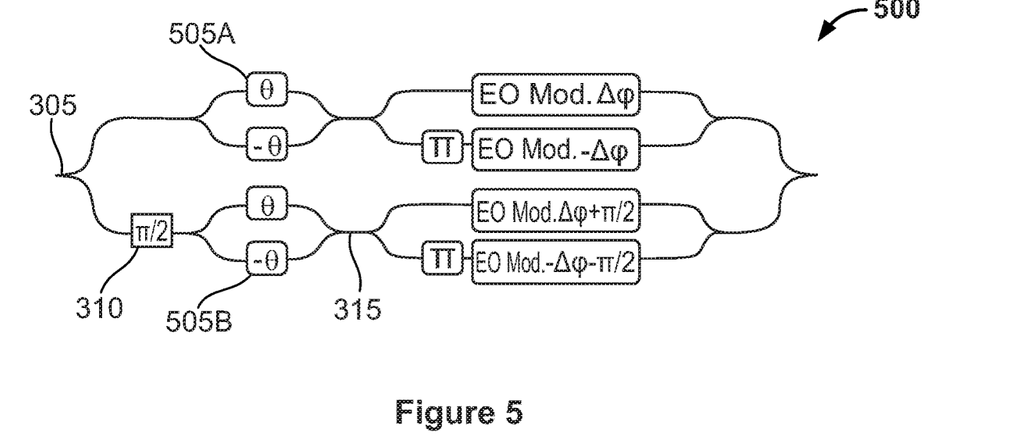
FIG. 5 illustrates a frequency shifter in accordance with at least one embodiment of the present invention.

A frequency shifter 500 with additional phase shifters 505A, 505B is illustrated in FIG. 5. See, for example, S. Liu et al., "High speed ultra-broadband amplitude modulators with ultrahigh extinction >65 dB," Optics Express, Vol. 25, No. 10, PP. 11254-11264 (2017), the contents of which are incorporated herein by reference, for a discussion of enhanced rejection using additional phase shifters. The frequency shifter 500 corresponds to the single sideband frequency modulator 300 illustrated in FIG. 3, but includes additional phase shifters 505A, 505B located between the first stage beam splitter 305 and the second stage beam splitters 315, with phase shifter 505B located after the first stage π/2 phase shifter 310. The additional phase shifters 505A, 505B are preferably of the TO-type.

Figure 1B:
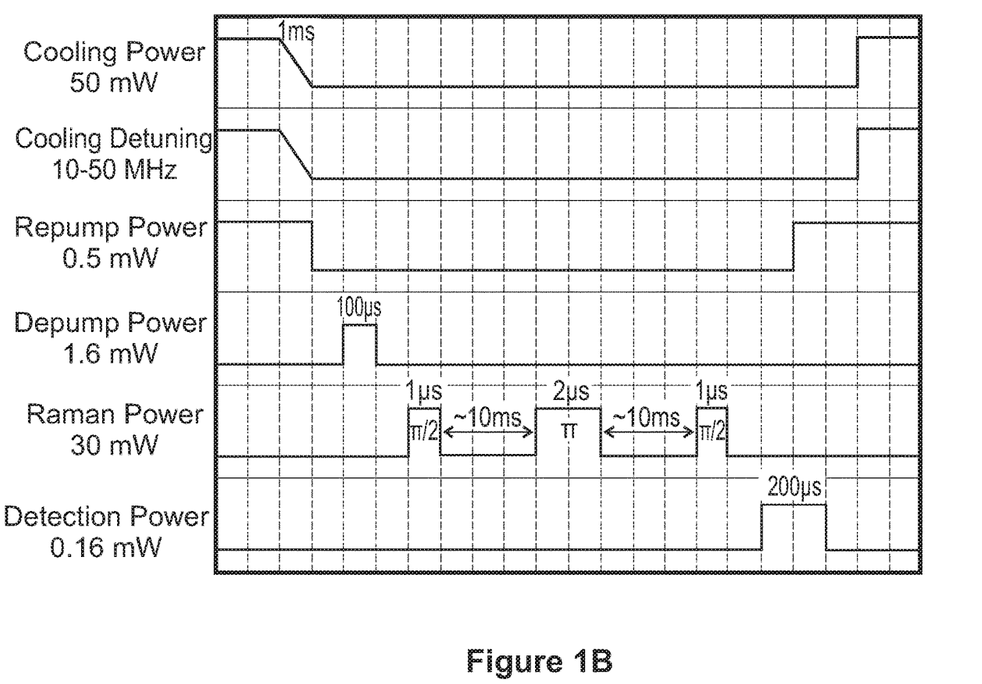
FIG. 1B illustrates the required timing of the various wavelengths in the $^{87}$Rb AI system.

As shown in FIG. 1B, there are time intervals when the compact laser source should not be generating any beams for the AI. For example, between the first and second Raman beam pulses and between the second and third Raman beam pulses, it is important that the cloud of atoms not be disturbed by any beams. To this end, the variable optical attenuators 245 are preferably very high contrast devices. When in the "on" state, the variable optical attenuators 245 preferably have minimal optical loss, thereby reducing the power demands on the seed laser 205, the optical amplifiers 220, 250, and the frequency doublers 225, 255. When in the "off" state, the variable optical attenuators 245 preferably have extremely high loss to minimize any potential interference with the cloud of atoms.

Figure 6:
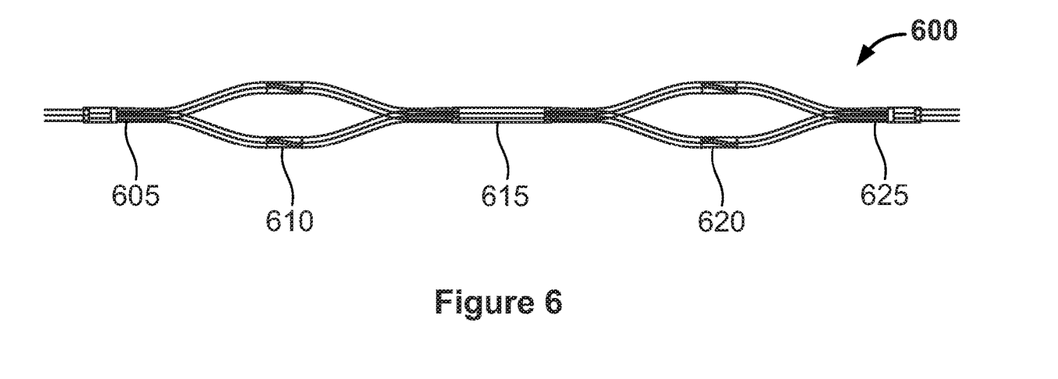
FIG. 6 illustrates a high contrast Mach-Zehnder interferometer in accordance with at least one embodiment of the present invention.

In at least one embodiment of the present invention, the variable optical attenuators 245 are preferably formed of a high contrast Mach-Zehnder interferometer 600, as illustrated in FIG. 6. The high contrast Mach-Zehnder interferometer 600 includes a beam splitter 605 that splits the incoming beam in two. Each beam output from the beam splitter 605 passes through a corresponding first stage phase shifter 610. The output beams from the first stage phase shifters 610 are combined and then split by a first coupler 615. Each beam output from the first coupler 615 passes through a corresponding second stage phase shifter 620. The output beams from the second stage phase shifters 620 are combined by a second coupler 625. The first stage phase shifters 610 and the second stage phase shifters 620 are preferably TO phase shifters. TO phase shifters offer low insertion loss, will readily work over the range of operating wavelengths without wavelength tuning, and can yield an overall Mach-Zehnder interferometer 600 extinction of 60 dB.

Figure 7:
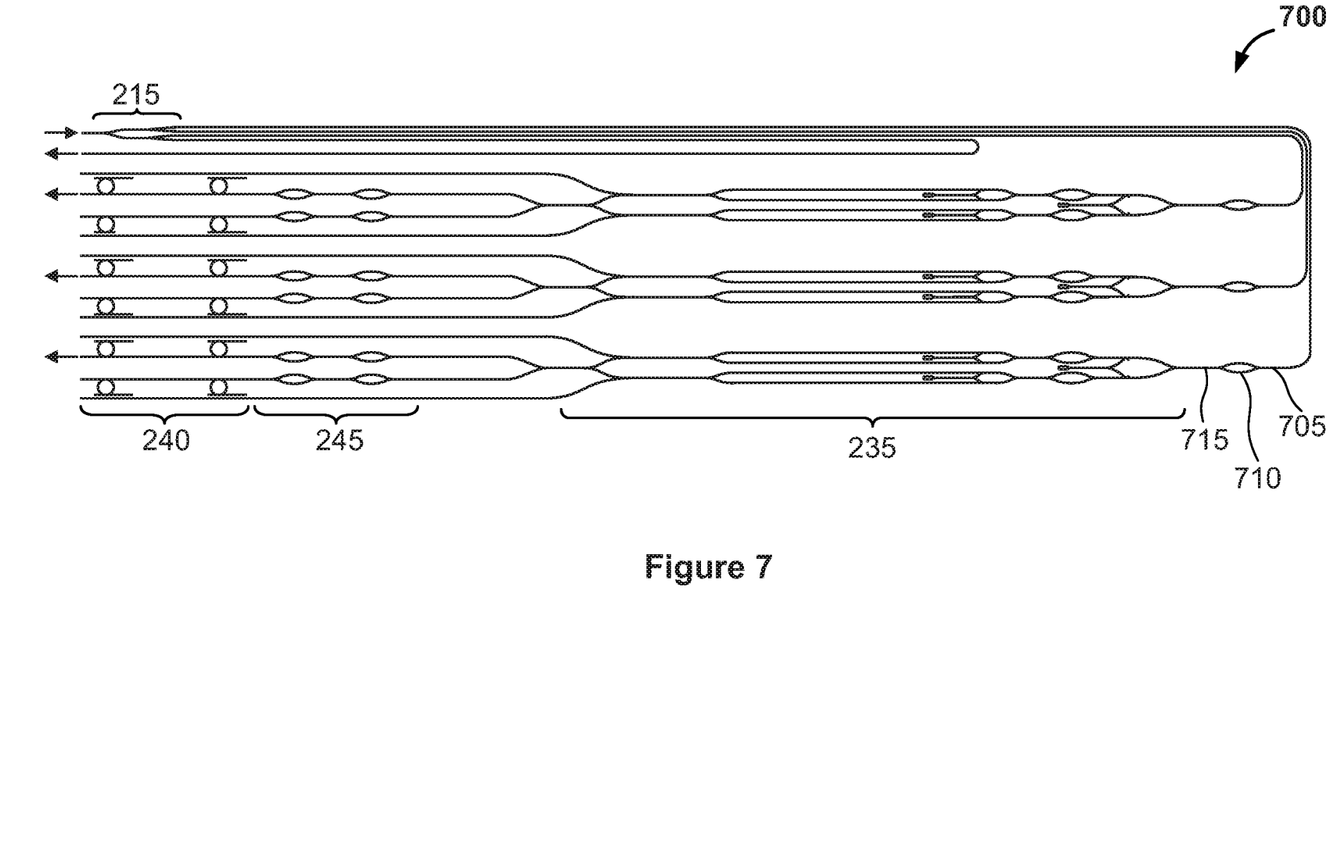
FIG. 7 illustrates a compact laser source in accordance with at least one embodiment of the present invention.

To ensure the greatest flexibility and greatest potential extinction of the compact laser source 700, at least one embodiment includes an additional beam splitter 705, a pair of parallel TO phase shifters 710, and a coupler 715, as shown in FIG. 7. FIG. 7 corresponds to one physical embodiment of a part of the compact laser source 200 generally illustrated in FIG. 2.

Figure 8:
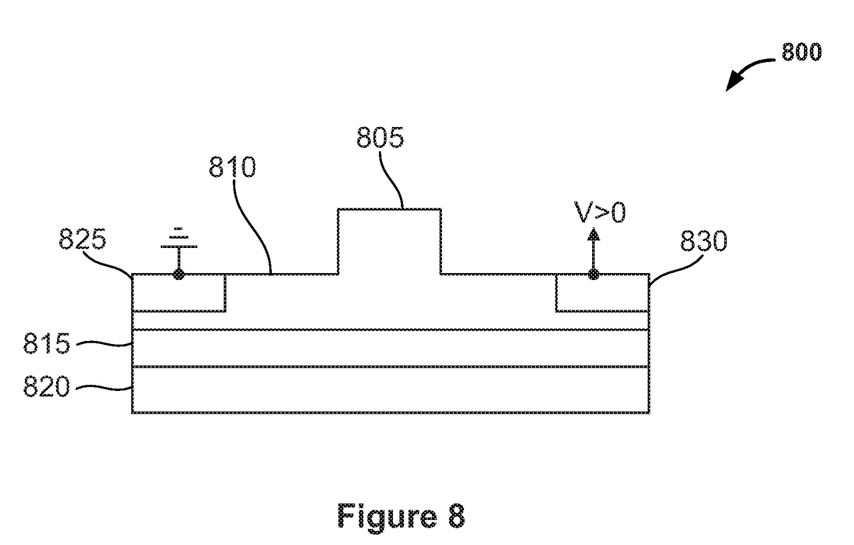
FIG. 8 illustrates a biased low loss waveguide employed in a silicon photonics motherboard for a compact laser source in accordance with at least one embodiment of the present invention.

As the compact laser source 200 may run at very high power levels, the waveguides employed in the compact laser source 200 preferably handle high power levels with minimal loss. By minimizing loss in the waveguides, this reduces the power demands on the seed laser 205, the optical amplifiers 220, 250, and the frequency doublers 225, 255. An exemplary biased low loss waveguide 800 employed in a silicon photonics optical motherboard for some embodiments of the present invention is illustrated in FIG. 8. See, for example, R. Jones et al., "Net continuous wave optical gain in a low loss silicon-on-insulator waveguide by stimulated Raman scattering," Optics Express, Vol. 13, No. 2, PP. 519-525 (2005), the contents of which are incorporated herein by reference. The biased low loss waveguide 800 includes a rib 805 formed by partially etching a silicon layer 810 on a buried oxide layer 815, which is on a silicon substrate 820. A p+ doped region 825 is formed on one side of the rib 805, while an n+ doped region 830 is formed on the other side of the rib 810. In operation, a positive bias is applied to the n+ doped region 830, while the p+ doped region 825 is grounded. This serves to minimize two photon absorption induced free carrier absorption as the carrier lifetime in the biased low loss waveguide 800 is reduced through the carriers being swept out of the biased low loss waveguide 800. A biased low loss waveguide 800 of this design offers the added benefit of filtering out unwanted optical modes that may sap power from the desired optical mode(s).

While the compact laser source 200 illustrated in FIG. 2 employs frequency doublers 225, 255, these frequency doublers 225, 255 may be replaced by sum frequency generators or frequency triplers, etc., in certain embodiments of the present invention. These sum frequency generators, frequency triplers, etc., allow generation of wavelengths other than half that of the seed laser 205, for example, at 850 nm. See, for example, D. V. Strekalov et al., "Optical sum-frequency generation in a whispering-gallery-mode resonator," New Journal of Physics, Vol. 16, 053025 (2014), the contents of which are incorporated herein by reference. Frequency doublers, frequency triplers, and sum frequency generators are all non-linear optical elements that use electro-optic material.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A laser source comprising:
   a seed laser adapted to generate a laser beam;
   a beam splitter adapted to receive the laser beam and to split the laser beam into a plurality of sub-beams; and
   at least one channel, each channel including:
   a frequency shifter adapted to receive a respective one of the plurality of sub-beams and to shift a frequency of the respective one of the plurality of sub-beams;
   a non-linear optical element adapted to receive the frequency shifted respective one of the plurality of sub-beams, to increase a frequency of the frequency shifted respective one of the plurality of sub-beams, and to output the increased frequency and frequency shifted respective one of the plurality of sub-beams as a respective output laser beam; and
   a feedback loop, the feedback loop adapted to receive a first of the plurality of sub-beams and to control a frequency of the laser beam based upon the received first of the plurality of sub-beams, the feedback loop including:
   a feedback optical amplifier adapted to receive the first of the plurality of sub-beams and to amplify the first of the plurality of sub-beams;
   a feedback non-linear optical element adapted to receive the amplified first of the plurality of sub-beams and to increase a frequency of the amplified first of the plurality of sub-beams; and
   a lock circuit adapted to receive the increased frequency, amplified first of the plurality of sub-beams and to generate a control signal to control the frequency of the laser beam.

2. The laser source of claim 1, wherein each channel further includes an optical filter adapted to receive the frequency shifted respective one of the plurality of sub-beams, to filter out unwanted sub-bands in the frequency shifted respective one of the plurality of sub-beams, and to output the filtered and frequency shifted respective one of the plurality of sub-beams to the non-linear optical element.

3. The laser source of claim 2, wherein the optical filter of each channel includes one or more respective micro-ring resonators.

4. The laser source of claim 1, wherein each channel further includes a variable optical attenuator adapted to receive the frequency shifted respective one of the plurality of sub-beams, to variably attenuate the frequency shifted respective one of the plurality of sub-beams, and to output the variably attenuated and frequency shifted respective one of the plurality of sub-beams to the non-linear optical element.

5. The laser source of claim 4, wherein the variable optical attenuator of each channel includes a respective high contrast Mach-Zehnder interferometer, each high contrast Mach-Zehnder interferometer including:
- a first stage beam splitter adapted to receive the frequency shifted respective one of the plurality of sub-beams and to split the frequency shifted respective one of the plurality of sub-beams into first and second sub-sub-beams;
- a first first stage phase shifter adapted to receive the first sub-sub-beam and to impose a predetermined phase shift ψ on the first sub-sub-beam;
- a second first stage phase shifter adapted to receive the second sub-sub-beam and to impose a predetermined phase shift −ψ on the second sub-sub-beam;
- a second stage coupler adapted to receive the ψ shifted first sub-sub-beam and the −ψ shifted second sub-sub-beam, to combine the ψ shifted first sub-sub-beam and the −ψ shifted second sub-sub-beam to form a third sub-sub-beam, and to split the third sub-sub-beam into fourth and fifth sub-sub-beams;
- a first second stage phase shifter adapted to receive the fourth sub-sub-beam and to impose a predetermined phase shift φ on the fourth sub-sub-beam;
- a second second stage phase shifter adapted to receive the fifth sub-sub-beam and to impose a predetermined phase shift −φ on the fifth sub-sub-beam; and
- a third stage coupler adapted to receive the φ shifted fourth sub-sub-beam and the −φ shifted fifth sub-sub-beam and to combine the φ shifted fourth sub-sub-beam and the −φ shifted fifth sub-sub-beam to form an attenuated, frequency shifted respective one of the plurality of sub-beams.

6. The laser source of claim 1, wherein each channel further includes an optical amplifier adapted to receive the frequency shifted respective one of the plurality of sub-beams, to amplify the frequency shifted respective one of the plurality of sub-beams, and to output the amplified and frequency shifted respective one of the plurality of sub-beams to the non-linear optical element.

7. The laser source of claim 6, wherein the optical amplifier of each channel includes one or more respective multiple quantum well gain stages.

8. The laser source of claim 1, wherein each channel further includes:
- an optical filter adapted to receive the frequency shifted respective one of the plurality of sub-beams and to filter out unwanted sub-bands in the frequency shifted respective one of the plurality of sub-beams;
- a variable optical attenuator adapted to receive the frequency shifted respective one of the plurality of sub-beams and to variably attenuate the frequency shifted respective one of the plurality of sub-beams; and
- an optical amplifier adapted to receive the variably attenuated, filtered, and frequency shifted respective one of the plurality of sub-beams and to amplify the variably attenuated, filtered, and frequency shifted respective one of the plurality of sub-beams, and to output the amplified, variably attenuated, filtered, and frequency shifted respective one of the plurality of sub-beams to the non-linear optical element.

9. The laser source of claim 8, wherein at least the beam splitter, the frequency shifter of each channel, the optical filter of each channel, the variable optical attenuator of each channel, the optical amplifier of each channel, and the non-linear optical element of each channel are formed on a single optical motherboard.

10. The laser source of claim 9, wherein the single optical motherboard includes a biased low loss waveguide.

11. The laser source of claim 1, wherein a wavelength of the laser beam is based upon a transition wavelength of an atom or a molecule.

12. The laser source of claim 1, wherein the frequency shifter of each channel is a respective single sideband frequency modulator, each single sideband modulator including:
- a first stage beam splitter adapted to receive the respective one of the plurality of sub-beams and to split the respective one of the plurality of sub-beams into first and second sub-sub-beams;
- a first stage π/2 phase shifter adapted to receive the second sub-sub-beam and to impose a π/2 phase shift on the second sub-sub-beam;
- a first second stage beam splitter adapted to receive the first sub-sub-beam and to split the first sub-sub-beam into third and fourth sub-sub-beams;
- a second second stage beam splitter adapted to receive the π/2 phase shifted second sub-sub-beam and to split the π/2 phase shifted second sub-sub-beam into fifth and sixth sub-sub-beams;
- a first second stage π phase shifter adapted to receive the fourth sub-sub-beam and to impose a π phase shift on the fourth sub-sub-beam;
- a second second stage π phase shifter adapted to receive the sixth sub-sub-beam and to impose a π phase shift on the sixth sub-sub-beam;
- a first frequency modulator adapted to receive the third sub-sub-beam and to impose a predetermined frequency detuning on the third sub-sub-beam;
- a second frequency modulator adapted to receive the π phase shifted fourth sub-sub-beam and to impose the predetermined frequency detuning on the π phase shifted fourth sub-sub-beam;
- a third frequency modulator adapted to receive the fifth sub-sub-beam and to impose the predetermined frequency detuning on the fifth sub-sub-beam;
- a fourth frequency modulator adapted to receive the π phase shifted sixth sub-sub-beam and to impose the predetermined frequency detuning on the π phase shifted sixth sub-sub-beam;
- a first first stage coupler adapted to receive the detuned third sub-sub-beam and the detuned π phase shifted fourth sub-sub-beam and to combine the detuned third sub-sub-beam and the detuned π phase shifted fourth sub-sub-beam to form a seventh sub-sub-beam;

a second first stage coupler adapted to receive the detuned fifth sub-sub-beam and the detuned $\pi$ phase shifted sixth sub-sub-beam and to combine the detuned fifth sub-sub-beam and the detuned $\pi$ phase shifted sixth sub-sub-beam to form an eighth sub-sub-beam; and a second stage coupler adapted to receive the seventh sub-sub-beam and the eighth sub-sub-beam and to combine the seventh sub-sub-beam and the eighth sub-sub-beam to form an output sub-beam.

13. The laser source of claim 12, wherein each single sideband frequency modulator further includes:

a first third stage beam splitter adapted to receive the first sub-sub-beam and to split the first sub-sub-beam into ninth and tenth sub-sub-beams;

a second third stage beam splitter adapted to receive the second sub-sub-beam and to split the second sub-sub-beam into eleventh and twelfth sub-sub-beams;

a first third stage phase shifter adapted to receive the ninth sub-sub-beam and to impose a predetermined phase shift $\theta$ on the ninth sub-sub-beam;

a second third stage phase shifter adapted to receive the tenth sub-sub-beam and to impose a predetermined phase shift $-\theta$ on the tenth sub-sub-beam;

a third third stage phase shifter adapted to receive the eleventh sub-sub-beam and to impose the predetermined phase shift $\theta$ on the eleventh sub-sub-beam;

a fourth third stage phase shifter adapted to receive the twelfth sub-sub-beam and to impose the predetermined phase shift $-\theta$ on the twelfth sub-sub-beam;

a first third stage coupler adapted to receive the $\theta$ shifted ninth sub-sub-beam and the $-\theta$ shifted tenth sub-sub-beam and to combine the $\theta$ shifted ninth sub-sub-beam and the $-\theta$ shifted tenth sub-sub-beam to form a phase shifted first sub-sub-beam; and a second third stage coupler adapted to receive the $\theta$ shifted eleventh sub-sub-beam and the $-\theta$ shifted twelfth sub-sub-beam and to combine the $\theta$ shifted eleventh sub-sub-beam and the $-\theta$ shifted twelfth sub-sub-beam to form a phase shifted second sub-sub-beam.

14. The laser source of claim 1, wherein the non-linear optical element of each channel comprises electro-optic material.

15. The laser source of claim 14, wherein the electro-optic material includes one or more of lithium niobate, lithium tantalate, potassium titanyl phosphate, lithium triborate, and aluminum nitride.

16. The laser source of claim 1, wherein each respective output laser beam has a respective single frequency or has a respective sequence of single frequencies.

* * * * *